United States Patent
Chen et al.

(10) Patent No.: US 11,552,193 B2
(45) Date of Patent: Jan. 10, 2023

(54) SEMICONDUCTOR DEVICE

(71) Applicant: SEMICONDUCTOR COMPONENTS INDUSTRIES, LLC, Phoenix, AZ (US)

(72) Inventors: Weize Chen, Phoenix, AZ (US); Mark Griswold, Gilbert, AZ (US); Jaroslav Pjencak, Dolni Becva (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 43 days.

(21) Appl. No.: 17/139,748

(22) Filed: Dec. 31, 2020

(65) Prior Publication Data
US 2022/0209008 A1 Jun. 30, 2022

(51) Int. Cl.
*H01L 29/78* (2006.01)
*H01L 29/66* (2006.01)
*H01L 29/06* (2006.01)

(52) U.S. Cl.
CPC ...... *H01L 29/7824* (2013.01); *H01L 29/0619* (2013.01); *H01L 29/66681* (2013.01)

(58) Field of Classification Search
CPC ............ H01L 29/7824; H01L 29/0619; H01L 29/66681–66704; H01L 21/8234–8249; H01L 29/66477–6684; H01L 29/78–7926; H01L 29/1033–1054; H01L 29/04–045; H01L 29/16–1608; H01L 29/36–365
See application file for complete search history.

(56) References Cited

U.S. PATENT DOCUMENTS

| | | | |
|---|---|---|---|
| 6,097,063 A | 8/2000 | Fujihira | |
| 2003/0040160 A1 | 2/2003 | Huang et al. | |
| 2006/0145250 A1 | 7/2006 | Ma | |
| 2011/0215402 A1 | 9/2011 | Lee | |
| 2012/0267717 A1 | 10/2012 | Toren et al. | |
| 2013/0134511 A1* | 5/2013 | Yang | H01L 21/761 438/420 |
| 2014/0001545 A1 | 1/2014 | Yang et al. | |
| 2016/0104796 A1 | 4/2016 | Yao et al. | |
| 2016/0181422 A1* | 6/2016 | Chiang | H01L 29/66681 257/339 |
| 2018/0151723 A1 | 5/2018 | Grote et al. | |
| 2020/0152788 A1* | 5/2020 | Kocon | H01L 29/42376 |

OTHER PUBLICATIONS

Abouelatta-Ebrahim M et al., Design considerations of high voltage RESURF nLDMOS: An analytical and numerical study, Ain Shams Eng J (2015), http://dx.doi.org/10.1016/j.asej.2014.12.003, 9 pages.
Search Report received in counterpart German Patent Application No. 10 2021 006 492.5, dated Oct. 12, 2022, 6 pages.

* cited by examiner

*Primary Examiner* — Shahed Ahmed
(74) *Attorney, Agent, or Firm* — Robert F. Hightower

(57) ABSTRACT

An embodiment of a semiconductor device may include a transistor having a first doped region and a second doped region that extend laterally underlying the source, body, and drain of the transistor. The transistor may have an embodiment that includes an additional bias contact to apply a bias potential to the first doped region and or alternately the second doped region.

20 Claims, 3 Drawing Sheets

SEMICONDUCTOR DEVICE

BACKGROUND

The present invention relates, in general, to electronics, and more particularly, to semiconductors, structures thereof, and methods of forming semiconductor devices.

In the past, the semiconductor industry utilized various methods and structures to form high voltage transistors that had a high breakdown voltage and that had a high switching rate. The high voltage transistors generally had to withstand drain-to-source voltages that were up to approximately two hundred volts (200V) or greater. It was also desirable that the high voltage transistor had a low on-resistance (Rdson). Typically, the transistor was formed with various doped regions to achieve the desired operation.

In some applications, the transistors sometimes had power losses during switching operations. Additionally, some applications desired a greater breakdown voltage. Some manufacturing methods were not compatible with established manufacturing operations.

Accordingly, it is desirable to have a high voltage transistor with an improved breakdown voltage and/or that has reduced power loss during switching operations.

Figure 1:
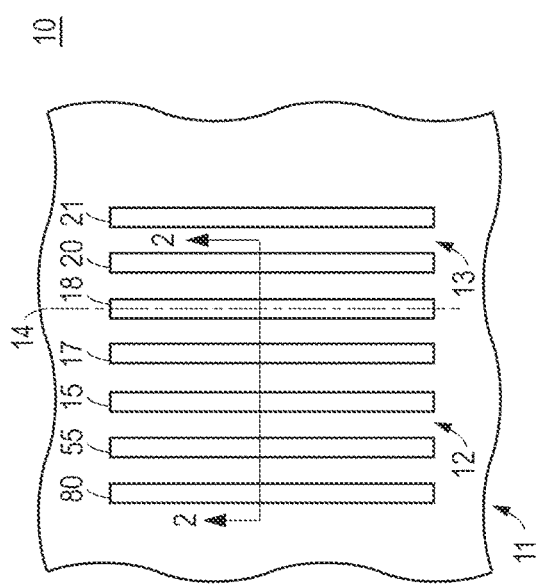
FIG. 1 illustrates an enlarged plan view of a portion of a simplified example of an embodiment of a semiconductor device that includes a high voltage transistor in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of a transistor such as an MOS transistor or a high electron mobility transistor (HEMT), or an emitter or a collector of a bipolar transistor, or a cathode or anode of a diode, and a control element or control electrode means an element of the device that controls current through the device such as a gate of an MOS transistor, a gate of a HEMT, or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, in some embodiments in a serpentine pattern). However, it is intended that the description is applicable to both a cellular implementation and a single base implementation.

The embodiments illustrated and described hereinafter may have embodiments and/or may be practiced in the absence of any element which is not specifically disclosed herein.

DETAILED DESCRIPTION OF THE DRAWINGS

FIG. 1 illustrates an enlarged plan view of a portion of a simplified example of an embodiment of a semiconductor device 10 that includes a high voltage transistor 11. Device 10 may, in some embodiments, include other electrical devices or structures that are not illustrated in FIG. 1. Transistor 11 may, in an embodiment, be formed as a plurality of transistor fingers or transistor elements, such as transistor elements 12 and 13, that each function as a transistor. The plurality of elements are interconnected to function as one transistor. For example, transistor element 12 may include a source region having a source electrode 15 that is formed adjacent to a gate region that has a gate electrode 17 which is spaced apart from a drain region having a drain electrode 18. Transistor 11 may also include an optional bias contact having a bias electrode 55. The drain region and drain electrode 18 may be shared commonly between elements 12 and 13. Element 13 may also include a gate region having a gate electrode 20 and a source region having a source electrode 21. In some embodiments, source electrode 21 may be similar to source electrode 15 and gate electrode 20 may be similar to gate electrode 17.

An axial centerline 14 represents the center of elements 12 and 13 such that transistor 11 may be substantially symmetrical around line 14. Those skilled in the art will appreciate that although transistor 11 is illustrated with two elements 12 and 13, transistor 11 may be formed to have many numbers of elements such as element 12 and 13. Isolation regions or isolation structures 80 may be formed to isolate transistor 11 from other portions of device 10.

Figure 2:
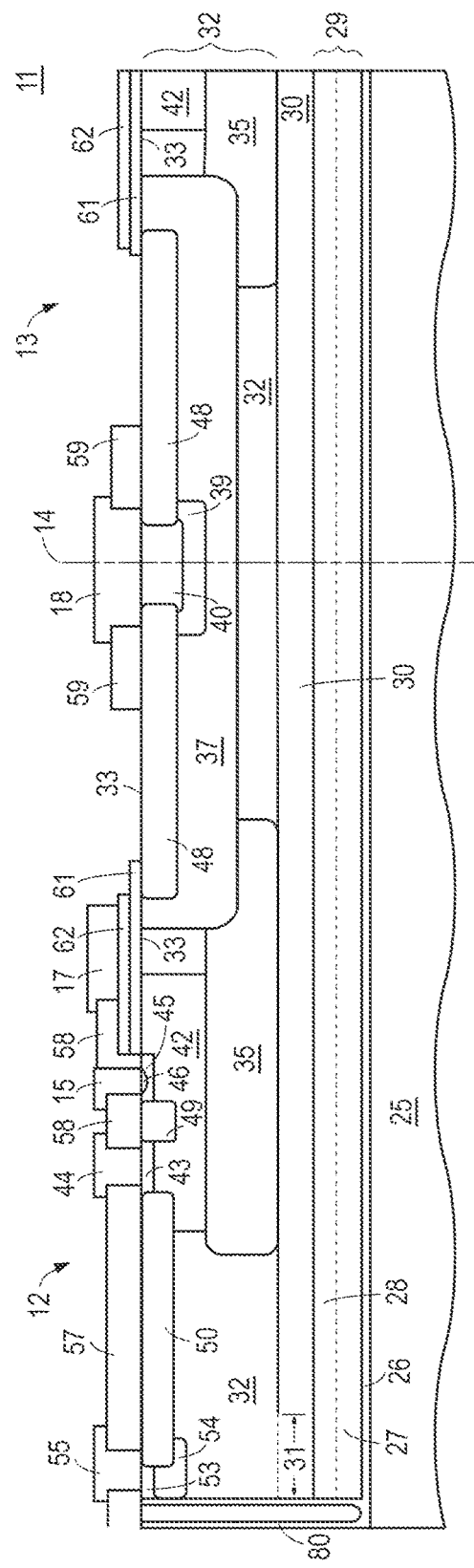
FIG. 2 illustrates an enlarged cross-sectional portion of an example of an embodiment of the transistor of FIG. 1 in accordance with the present invention.

FIG. 2 illustrates an enlarged cross-sectional portion of an example of an embodiment of transistor 11 along cross-section line 2-2 of FIG. 1.

Figure 3:
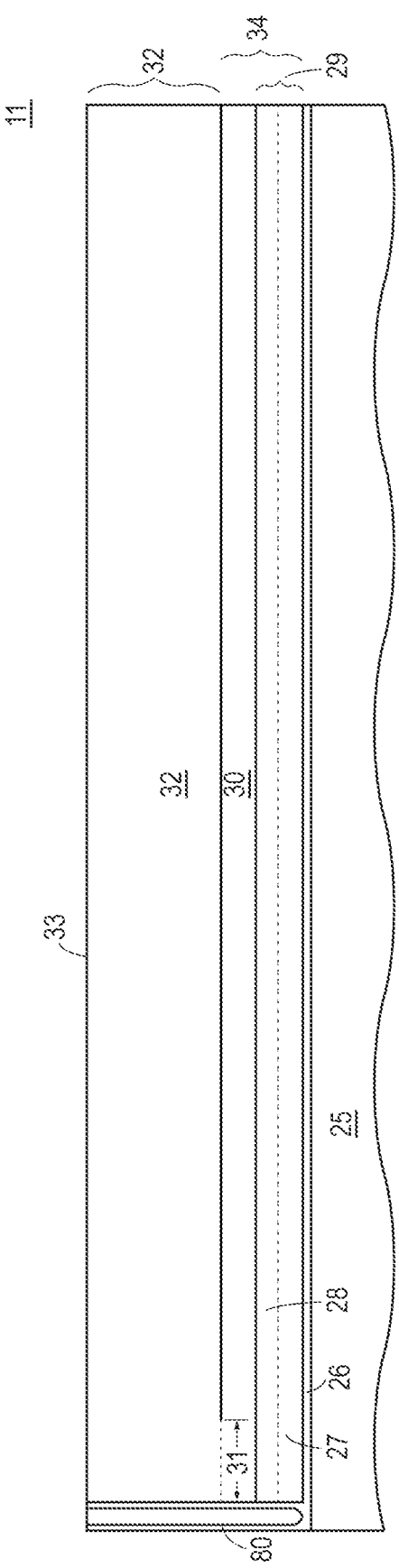
FIG. 3 illustrates an enlarged cross-sectional view of an example of an embodiment of the transistor of FIG. 1 at a stage of an example of an embodiment of a method of forming the transistor in accordance with the present invention.

FIG. 3 illustrates an enlarged cross-sectional view of an example of an embodiment of transistor 11 at a stage of an example of an embodiment of a method of forming transistor 11. This description has references to at least FIGS. 2-3.

Transistor 11 may be formed on a semiconductor substrate 25. Substrate 25 may have an embodiment that is a silicon-on-insulator (SOI) substrate or alternately may be a silicon substrate. An embodiment may also include that an insulator layer or insulator 26 may be formed on substrate 25 to provide electrical isolation between substrate 25 and elements of transistor 11. Insulator 26 may be formed from silicon dioxide or silicon nitride or other insulator materials that are well known to those skilled in the semiconductor art. In some embodiments, insulator 26 may be replaced by a doped buried layer. An embodiment may include replacing insulator 26 with an N-type buried layer.

Referring to FIG. 3, a doped layer 34 may be formed on insulator 26. Layer 34 may have an embodiment with a P-type conductivity. An embodiment may include using a modulated doping procedure to form a portion of layer 34, such as for example layer 27, with a higher active doping concentration than a different portion of layer 34, such as for example layer 28. Layer 28 may form a doped region that may function as a blocking layer and layer 27 may form a doped region that may function as an anti-back gate layer. Layer 28 may have an embodiment formed to have an active doping concentration of approximately 2E14 to approximately 1E15 atoms/cm$^3$ and alternately may be approximately 5E14 atoms/cm$^3$. Thereafter, a portion of layer 34 may be doped with an opposite type conductivity to form a layer 30, thereby leaving a layer 29 to include layers 27 and 28. An embodiment of layer 30 may be formed with an N-type conductivity and with an active doping concentration of approximately 9E15 to approximately 2E16 atoms/cm$^3$ or alternately approximately 1E16 atoms/cm$^3$. Layer 30 may be formed on the entire length of layer 29, or alternately may be formed to have a width across layer 29 that is shorter than layer 29, or alternately layer 28, by a distance 31. Alternately, layer 29 may be formed on insulator 26 by epitaxial techniques and layer 30 may be formed on layer 29.

Thereafter, a doped region 32 may be formed on layer 30. An embodiment of region 32 may be epitaxially formed on layer 30 with a dopant type that is opposite to the doping type of layer 30. Alternately, region 32 may be formed by doping a different layer that may be formed on layer 30. Region 32 may have an embodiment with a P-type conductivity and an active doping concentration that is less than the active doping concentration of layer 30. The active doping concentration of region 32 may be approximately 2E15 to approximately 5E15 or alternately approximately 2.6E15. Subsequently, isolation structures 80 may be formed. Isolation structures 80 may be formed as a deep trench isolation structures that extend from a surface 33 of region 32 a distance into region 32 to intersect with insulator 26. Those skilled in the art will appreciate that structures 80 may be formed by creating a trench opening into region 32 and forming an insulating material along the sidewalls of the trench opening. Thereafter, any openings in the insulating material may be filled with other material, such as for example polysilicon. Structures 80 and insulator 26 form an isolation structure that isolates transistor 11 from any other portions of device 10 (FIG. 1).

Referring back to FIG. 2, other regions of transistor 11 may be formed within region 32. For example, portions of region 32 may be doped to form the regions. A body region 42 of transistor 11 may be formed as a doped region within region 32, and a source region 45 may be formed in region 42. In some embodiments, source region 45 may include a source contact region 46 and an adjacent and/or underlying source doped region that may, in some embodiments, have a lighter active dopant concentration than source contact region 46. A portion of region 42 may underlie and intersect with region 45. Body region 42 may include a body contact region 43 that facilitates forming a low resistance contact to body region 42. In an embodiment, a body conductor 44 may be connected to electrode 15 to form a connection between body region 43 and source region 45. A doped region 35 may be formed underlying and intersecting with region 42 and also intersecting layer 30. An embodiment of region 35 may have a doping concentration that is greater than layer 28, and also no less than or alternately greater than the doping concentration of layer 30. The doping concentration of region 35 may be approximately 2E16 to 1E17 atoms/cm$^3$ and alternately may be approximately 3E16 atoms/cm$^3$. Region 35 may, in some embodiments, assist in reducing the surface electric field (Resurf), or alternately increasing the breakdown voltage of transistor 11, and may be referred to as a Resurf region.

A drift region may be formed as a doped region 37 on the surface of region 32 and extending vertically into region 32. Region 37 may have an embodiment that does not intersect or extend into layer 30, but may have an embodiment that may intersect region 35. An embodiment of region 37 may have a doping concentration that is greater than layer 28, and also no less than or alternately greater than the doping concentration of layer 30. The doping concentration of region 37 may be approximately 5E15 to approximately 5E16 atoms/cm$^3$ and alternately may be approximately 2E16 atoms/cm$^3$. A drain region of transistor 11 may be a portion of region 37 that underlies a drain contact or contact region 40. Drain contact region 40 may be a doped region that has a high active dopant concentration in order to facilitate forming a low resistance electrical connection to the drain region. For example, a low resistance connection between drain electrode 18 and region 37. An optional doped region 39 may be formed underlying region 40 and extending vertically into region 37. For example, region 39 may be formed within region 37 and region 40 may be formed within region 39, or alternately within region 37. Region 39 may assist in reducing charge crowding at the drain of transistor 11 thereby improving the on-resistance. Region 35 may extend to underlie a portion of region 37. In an embodiment, region 35 does not underlie the drain region nor regions 39-40. Because the drain region of transistor 11 may be shared with elements 12 and 13, another and substantially similar portion of region 37 may also extend in the opposite direction from line 14 to assist in forming element 13 (FIG. 1). Additionally, a portion of region 35 may also extend in the opposite direction from region 37 to assist in forming element 13. A bias contact or bias region 54 may be formed as a doped region on the surface of region 32 and spaced away from region 39. A contact region 53 may be formed within region 54 and with a higher active doping concentration in order to form a low resistance connection to regions 54 and 32. An embodiment may include that regions 42, 43, and 45 are positioned laterally between region 54 and the drain, or alternately region 40. An embodiment of transistor 11 may include that layer 30 and regions 35, 42, and 43 may be formed to have an N-type conductivity, and regions 32, 37, 39, 40, 45, 46, 53, and 54 may be formed to have a P-type conductivity.

A gate structure may be formed overlying a portion of region 42 and overlying a portion of region 32 that is positioned laterally between regions 42 and 37. The gate structure may include a gate insulator 61 that is formed overlying a portion of region 42 that is adjacent to region 45, and overlying the portion of region 32 that is between region 42 and region 37. Those skilled in the art will appreciate that insulator 61 is much thinner than an insulator 48 and insulator 26. A gate conductor 62 may be formed on insulator 61. Conductor 62 may be formed overlying the portion of region 42 that is laterally adjacent to region 45 and overlying the portion of region 32 that is between regions 37 and 42. The portion of region 42 underlying conductor 62 forms the channel region of transistor 11. An embodiment of insulator 61 and conductor 62 may also be formed to overlie a portion of region 37 that is adjacent to region 32. Insulator 61 and conductor 62 may be formed from a variety of well-known respective insulator materials and gate conductor materials. Conductor 62 may be connected to electrode 17.

Insulators 48, 49, and 50 may be formed in region 32 and overlying respective regions 37, 42, and a portion of region 32 that extends from region 43 toward region 54. Insulators 48, 49, and 50 may assist in reducing leakage currents between elements of transistor 11. An embodiment of insulators 48-50 may be formed using shallow trench techniques. An embodiment may include insulators 57, 58, and 59 that may be used to assist in keeping some of the electrodes electrically isolated.

In operation, source region 45 generally receives a high voltage. For example, the high voltage may be greater than one hundred volts (100 V) or may be up to two hundred volts (200 V) or greater. Body region 42 or alternately region 43 receives a voltage that is substantially similar to the voltage received by region 45. Bias region 54 receives a voltage that is no greater than a voltage received by the drain or alternately may be a voltage of substantially a fixed reference voltage. An embodiment of the fixed reference voltage may be a ground reference voltage. In an embodiment, the voltage received by bias region 54 is a substantially constant voltage. For the case of transistor 11 being disabled, gate conductor 62 receives a voltage close to the voltage of region 45, but the drain (for example region 40 or region 37 under region 40) may receive a voltage that is much less. In some embodiments, region 40 may receive a voltage that is near the ground reference voltage. Layer 30 is electrically connected to body region 42 through region 35, thus layer 30 is formed to receive the voltage applied to body region 42. Region 43 usually receives a voltage that is near to the voltage applied to source region 45. These voltage combinations reverse bias the P-N junction formed between layer 30 and region 32 along the interface with region 32, and the P-N junction along the interface of region 35 with regions 32 and 37. The depletion regions of these P-N junctions are substantially depleted of carriers by the voltage. The doping concentration of layer 30 assists in forming the depletion region to substantially deplete the region of carriers. For example, doping layer 30 heavier than region 32 allows the depletion region to spread into region 32. The depletion regions drop the electrical field that forms between source region 45 and the drain region (for example region 40) across the depletion regions which assists in improving the breakdown voltage of transistor 11. Additionally, although layer 28 is a floating layer that is not directly connected to a potential, a potential may be coupled to layer 28. For example, the voltage applied to contact electrode 55 or alternately region 54 may be coupled to layer 28 across layer 30 and hold layer 28 at a potential that is between the potentials applied to regions 54 and 43. In an embodiment, the potential on layer 28 (V28) may be the potential on region 54 (V54) plus a percent (X %) of the difference between the potentials on regions 54 (V54) and 43 (V43). V28=V54+(X %*(V43−V54)). An embodiment may include that the percent (X %) may be between approximately twenty-five percent (25%) and approximately seventy-five percent (75%). An embodiment may be approximately fifty percent (50%). For example, if region 54 is near zero and region 43 is approximately two hundred volts, layer 28 may have a potential of approximately one hundred volts (X=50%). An embodiment may include that the potentials on regions 54 and 43 may substantially fixed during operation, thus, the potential on layer 28 may be substantially fixed.

For the case of transistor 11 being enabled, the drain receives a voltage that is a few tenths of a volt less than region 45. For example, may be approximately 0.1 to approximately 0.5 volts. An embodiment may include that the drain receives a voltage that is no greater than approximately one volt less than region 45 for operation in the linear region of the transistor characteristics. Alternately, the drain may receive approximately ten volts less than region 45 for operation in the saturation region of the transistor characteristics. In an example embodiment the drain voltage may be between approximately zero volts to approximately 199.5 or approximately 199.9 volts for a source voltage of approximately two hundred volts (200V). Bias region 54 receive the same voltage as before, this lower voltage is applied to region 32 underlying region 54, but layer 30 is at the higher voltage from region 43. Thus, the P-N junction between layer 30 and region 32 underlying region 54 is depleted of carriers. Additionally, the depletion region of the P-N junction between layer 30 and the portion of region 32 underlying region 37 is also depleted. The voltage applied to region 54 is coupled to layer 28 across layer 30. Thus layer 28 is at a potential that is between the potentials applied to regions 53 and 43, as explained hereinbefore. As can be seen, the potential from the bias contact keeps layer 28 at a substantially constant voltage for both the enabled and disabled states of transistor 11. An embodiment may include that the potential of region 43 may be different from that of source region 45. Thus, in an embodiment, the voltage or potential of layer 28 may be independent of voltages applied to the drain or source.

In an optional embodiment, layer 30 may be formed to be shorter than layer 28 by distance 31. Distance 31 may have an embodiment that is approximately two to approximately three (2-3) microns. However, the potential of layer 28 remains at the substantially constant voltage as explained hereinbefore.

The depletion region assists in isolating layer 28 from the voltages applied to the drain. In some applications, the depletion region formed along layer 30 may assist in minimizing current flow from the drain region through layer 30 to substrate 25. For example, the current may be parasitic A.C. current. The substantially constant potential of layer 28 helps minimize capacitive coupling from region 32 across insulator 26 to substrate 25. Reducing the capacitive coupling reduces power loss during the switching of transistor 11. Thus, layers 28 and 30 assist in improving the breakdown voltage of transistor 11 and assist in reducing power loss during the switching of transistor 11.

Figure 4:
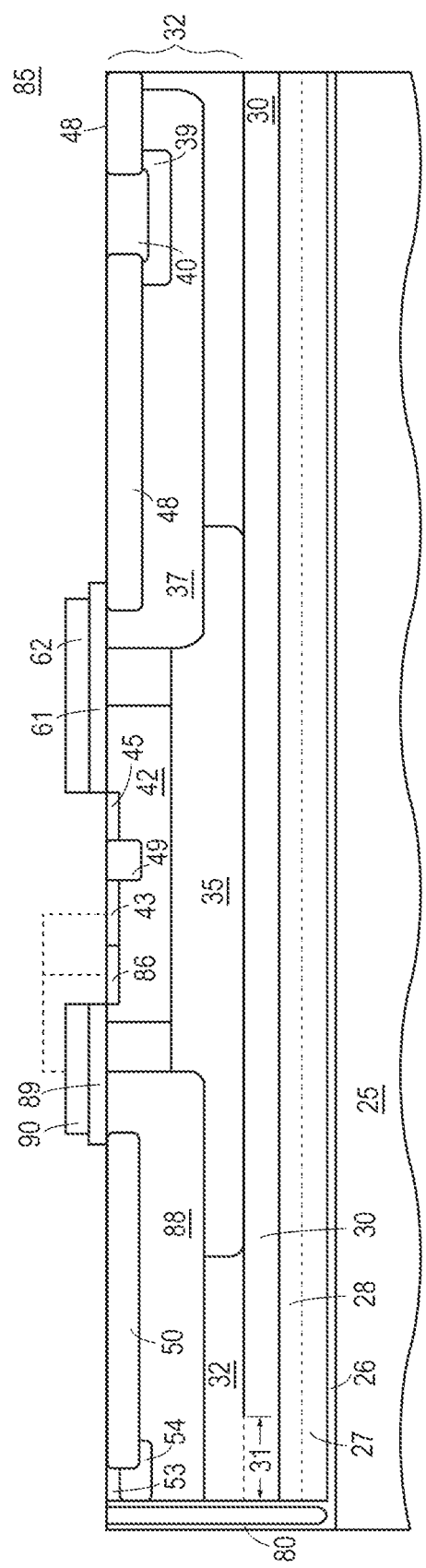
FIG. 4 illustrates an enlarged cross-sectional portion of an example of an embodiment of a transistor that may have an embodiment that may be an alternate embodiment of the transistor of FIG. 1 in accordance with the present invention.

FIG. 4 illustrates an enlarged cross-sectional portion of an example of an embodiment of a transistor 85 that may have an embodiment that may be an alternate embodiment of transistor 11 (FIG. 2). Transistor 85 is substantially similar to transistor 11 except that transistor 85 has additional doped regions 86 and 88. Transistor 85 also includes an additional gate structure having a gate insulator 89 and gate conductor 90 that are substantially the same as insulator 61 and conductor 62. Gate conductor 90 is connected to region 42 as illustrated by the dashed line. Region 88 is formed to extend from surface 33 into region 32 and has at least a portion underlying region 54. Region 88 has the same conductivity type as region 37 and substantially the same doping concentration. Region 86 is formed with region 42 and adjacent to region 43.

In operation, region 88 functions as a drift region similarly to region 37. The voltage across region 88 varies laterally across region 88 as it is depleted. Region 54 functions as a drain region. An embodiment may include that region 54 may be held at a substantially fixed reference potential. Gate conductor 90 is held at the potential of region 86. Region 86 is electrically connected to regions 42 and 43, illustrated in a general manner by dashed lines. This voltage configuration assists in keeping the potential of layer 28 at a substantially constant voltage for both the enabled and disabled states of transistor 85 and during switching of transistor 85.

Figure 5:
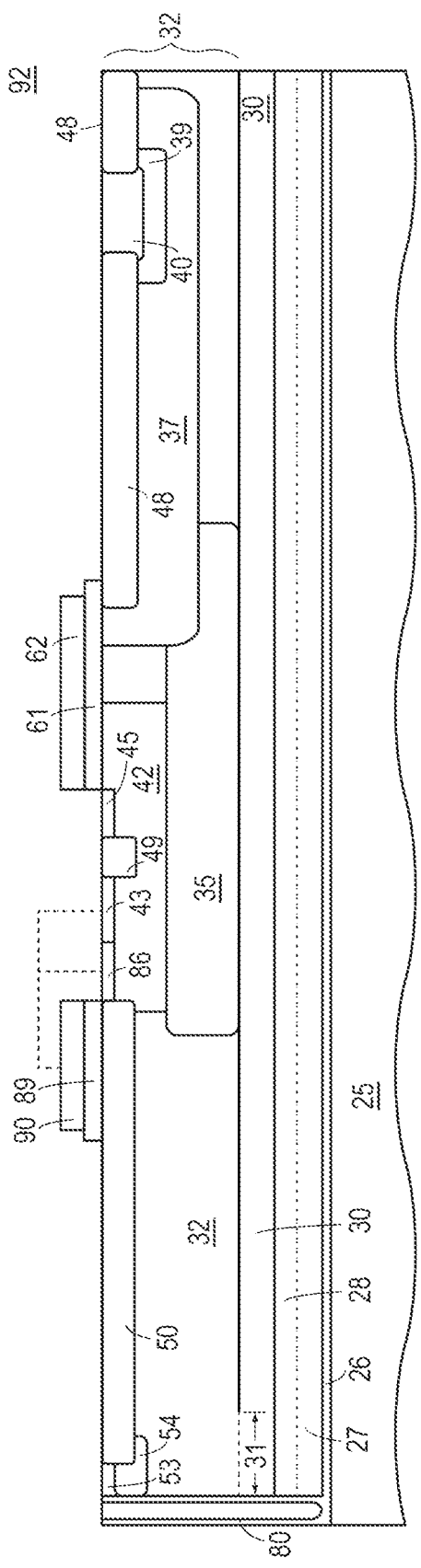
FIG. 5 illustrates an enlarged cross-sectional portion of an example of an embodiment of a different transistor that may have an embodiment that may be an alternate embodiment of the transistor of FIG. 4 in accordance with the present invention.

FIG. 5 illustrates an enlarged cross-sectional portion of an example of an embodiment of a transistor 92 that may have an embodiment that may be an alternate embodiment of transistor 85 (FIG. 4). Transistor 92 is substantially similar to transistor 85 except that doped region 88 is omitted and region 50 is expanded laterally to underlie insulator 89 or alternately the area occupied by insulator 89 in FIG. 4. Regions 86, 42, and 54 form a parasitic PNP transistors. In the event that the voltage applied between regions 86 and 54 is large, the PNP transistor could absorb some of the energy.

Figure 6:
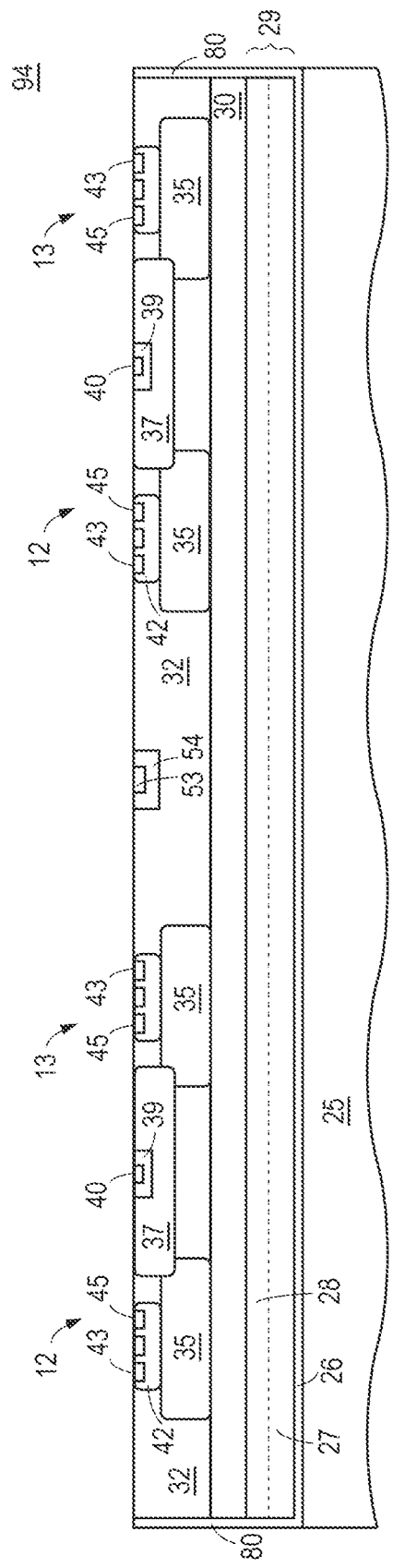
FIG. 6 illustrates an enlarged cross-sectional portion of an example of an embodiment of a transistor that may have an embodiment that may be an alternate embodiment of the transistors of FIG. 1 or 4 or 5 in accordance with the present invention.

FIG. 6 illustrates an enlarged cross-sectional portion of an example of an embodiment of a transistor 94 that may have an embodiment that may be an alternate embodiment of transistor 11 (FIG. 1) or any of transistors 85 or 92. Transistor 94 is substantially the same as transistor 11 except that regions 53-54 are moved and positioned between two set of elements that are similar to elements 12 and 13 (FIG. 1). Thus, regions 53-54 are moved from adjacent to structures 80 to a different position that is in-between two sets of the elements. For example, between two source regions, or alternately two body regions. Those skilled in the art will understand that the gate insulator, gate electrodes and other elements are omitted for clarity of the drawings, and to assist in showing the alternate positioning of regions 53-54.

From all the foregoing, one skilled in the art will appreciate that a semiconductor device having a transistor may comprise:

a semiconductor substrate, such as for example substrate 25;

an insulator, such as for example insulator 27, on the semiconductor substrate;

a source region, such as for example region 45, of a first conductivity type, such as for example P-type, overlying the insulator;

a drift region, such as for example region 37, of the first conductivity type, overlying the insulator;

drain region, such as for example region 40, of the first conductivity type within the drift region and overlying the insulator, the drain region spaced apart from the source region by at least a portion of the drift region;

a first doped region, such as for example layer 28, of the first conductivity type on the insulator having a first doping concentration, the first doped region formed to extend continuously across the insulator underlying the source region, the drain region, and the drift region, the first doped region;

a restriction layer, such as for example layer 30, of a second conductivity type, such as for example N-type, on the first doped region and having a second doping concentration that is greater than the first doping concentration, the restriction layer formed to extend continuously across the first doped region underlying the source region, the drain region, and the drift region;

an epitaxial layer, such as for example layer 32, of the first conductivity type on the restriction layer, the epitaxial layer having a third doping concentration that is less than the second doping concentration and greater than the first doping concentration wherein a portion of the epitaxial layer forms a P-N junction with the restriction layer;

a body region, such as for example one of regions/35/42/43, of the second conductivity type in the epitaxial layer wherein the source region is in the body region wherein the body region is electrically coupled to the restriction layer and wherein the restriction layer receives a potential applied to the body region; and a bias contact, such as for example one of regions 53/54, including a second doped region of the first conductivity type formed in the epitaxial layer, the bias contact electrically coupled to the first doped region wherein a potential applied to the bias contact is applied to a portion of the P-N junction.

An embodiment may include a depletion region along the restriction layer is substantially depleted for an interval that the transistor is disabled.

The transistor may have an embodiment that may include a depletion region along the restriction layer is substantially depleted for an interval that the transistor is enabled.

An embodiment of the transistor may include that a potential on the first doped region may be substantially constant for a first interval that the transistor is enabled and for a second interval that the transistor is disabled.

An embodiment may also include a third doped region, such as for example region 35, of the second conductivity type in the epitaxial layer and extending to abut both the restriction layer and the body region.

In an embodiment the third doped region may underlie the body region, the source region and a portion of the drift region but does not underlie the drain region.

An embodiment may include that the restriction layer underlies the bias contact.

In an embodiment a portion of the epitaxial layer may extend between and abuts the bias contact and the restriction layer.

An embodiment may include that the restriction layer does not underlie the bias contact.

Another embodiment may include that the first doped region underlies the bias contact.

The transistor may have an embodiment wherein the restriction layer does underlie the bias contact.

Those skilled in the art will appreciate that an embodiment of a semiconductor device having a transistor may comprise:

a first doped region, such as for example region 32, of a first conductivity type, such as for example P-type, and a first doping concentration;

a drift region, such as for example region 37, of the first conductivity type within the first doped region and having a drain region, such as for example region 40 or underlying region 40, of the first conductivity type formed therein;

a body region, such as for example region 42, of a second conductivity type, such as for example N-type, spaced a distance from the drift region;

a source region, such as for example region 45, of the first conductivity type within the body region;

a channel region positioned between the source region and the drift region;

a restrictive layer, such as for example layer 30, of the second conductivity type and having a second doping concentration that is greater than the first doping concentration, the restrictive layer extending continuously underlying the body region, the source region, the channel region, the drift region, and the drain region wherein the restrictive layer is electrically connected to the body region, such as for example through region 35; and a blocking layer, such as for example layer 28, of the first conductivity type and a second doping concentration that is less than the first doping concentration, the blocking layer underlying the restrictive layer and abutting the restrictive layer wherein a potential of the blocking layer is substantially constant.

The transistor may have an embodiment that may also include a second doped region, such as for example region 35, of the second conductivity type formed on the restrictive layer and extending to contact the body region.

In an embodiment, the second doped region may underlie the body region and at least a portion of the drift region but does not underlie the drain region.

In an embodiment, at least a portion of the restrictive layer along a length of the restrictive layer may be substantially depleted of carriers under a condition of the transistor being enabled.

An embodiment may include a bias contact, such as for example one of regions 53/54, formed as a second doped region of the first conductivity type in the first doped region.

The transistor may have an embodiment wherein a potential of the blocking layer is substantially constant under a condition of the transistor being enabled and disabled.

Those skilled in the art will appreciate that an embodiment of a method of forming a semiconductor device having a transistor may comprise:

providing a semiconductor substrate;

forming a first doped region, such as for example layer 28, of a first conductivity type, such as for example P-type, overlying the semiconductor substrate;

forming a second doped region, such as for example region 30, of a second conductivity type, such as for example N-type, on the first doped region, the second doped region having a first doping concentration; forming a third doped region, such as for example layer 32, of the first conductivity type on the second doped region, the third doped region having a second doping concentration that is less than the first doping concentration; and forming a body region, a source region within the body region, a drift region within the first doped region, and a drain region within the drift region, wherein the first doped region and the second doped region extend to continuously underlie the source region, the drift region, and the drain region, and wherein the second doped region is electrically coupled to the body region through.

The method may have an embodiment that may include forming a bias contact as a fourth doped region, such as for example region 53 or 54, of the first conductivity type within the third doped region wherein a potential of the first doped region is substantially constant for both an enabled and a disabled operational state of the transistor.

An embodiment may include forming the fourth doped region to receive the potential independently of voltages applied to the source region, the body region, and the drain region.

In view of all of the above, it is evident that a novel device and method is disclosed. Included, among other features, is forming a transistor having a blocking layer and restricting layer. The blocking layer is held at a substantially constant voltage which reduces power loss during switching of the transistor. The restricting layer is coupled to the body region and forms a depletion zone that assists in improving the breakdown voltage of the transistor.

While the subject matter of the descriptions is described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. For example, the subject matter has been described for a particular P-channel or P-type MOS transistor, although the method is directly applicable to N-channel or N-type MOS transistors. Those skilled in the art will appreciate that the structure is also applicable to diodes as well as transistors.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A semiconductor device having a transistor comprising:
a semiconductor substrate;
an insulator on the semiconductor substrate;
a source region of a first conductivity type overlying the insulator;
a drift region of the first conductivity type overlying the insulator;
drain region of the first conductivity type within the drift region and overlying the insulator, the drain region spaced apart from the source region by at least a portion of the drift region;
a first doped region of the first conductivity type on the insulator having a first doping concentration, the first doped region formed to extend continuously across the insulator underlying the source region, the drain region, and the drift region;
a restriction layer of a second conductivity type on the first doped region and having a second doping concentration that is greater than the first doping concentration, the restriction layer formed to extend continuously across the first doped region underlying the source region, the drain region, and the drift region;
an epitaxial layer of the first conductivity type on the restriction layer, the epitaxial layer having a third doping concentration that is less than the second doping concentration and greater than the first doping concentration wherein a portion of the epitaxial layer forms a P-N junction with the restriction layer;
a body region of the second conductivity type in the epitaxial layer wherein the source region is in the body region wherein the body region is electrically coupled to the restriction layer and wherein the restriction layer receives a potential applied to the body region; and
a bias contact including a second doped region of the first conductivity type formed in the epitaxial layer, the bias contact electrically coupled to the first doped region wherein a potential applied to the bias contact is applied to a portion of the P-N junction.

2. The semiconductor device of claim 1 wherein a depletion region along the restriction layer is substantially depleted for an interval that the transistor is disabled.

3. The semiconductor device of claim 1 wherein a depletion region along the restriction layer is substantially depleted for an interval that the transistor is enabled.

4. The semiconductor device of claim 1 wherein a potential on the first doped region is substantially constant for a first interval that the transistor is enabled and for a second interval that the transistor is disabled.

5. The semiconductor device of claim 1 further including a third doped region of the second conductivity type in the epitaxial layer and extending to abut both the restriction layer and the body region.

6. The semiconductor device of claim 5 wherein the third doped region underlies the body region, the source region and a portion of the drift region but does not underlie the drain region.

7. The semiconductor device of claim 1 wherein the restriction layer underlies the bias contact.

8. The semiconductor device of claim 7 wherein a portion of the epitaxial layer extends between and abuts the bias contact and the restriction layer.

9. The semiconductor device of claim 1 wherein the restriction layer does not underlie the bias contact.

10. The semiconductor device of claim 9 wherein the first doped region underlies the bias contact.

11. The semiconductor device of claim 1 wherein the restriction layer underlies the bias contact.

12. A semiconductor device having a transistor comprising:
a first doped region of a first conductivity type and a first doping concentration;
a drift region of the first conductivity type within the first doped region and having a drain region of the first conductivity type formed therein;
a body region of a second conductivity type spaced a distance from the drift region;
a source region of the first conductivity type within the body region;
a channel region positioned between the source region and the drift region;
a restrictive layer of the second conductivity type and having a second doping concentration that is greater than the first doping concentration, the restrictive layer extending continuously underlying the body region, the source region, the channel region, the drift region, and the drain region wherein the restrictive layer is electrically connected to the body region; and
a blocking layer of the first conductivity type, the blocking layer having a second doping concentration that is less than the first doping concentration, the blocking layer underlying the restrictive layer and abutting the restrictive layer wherein a potential of the blocking layer is substantially constant.

13. The semiconductor device of claim 12 further including a second doped region of the second conductivity type formed on the restrictive layer and extending to contact the body region.

14. The semiconductor device of claim 13 wherein the second doped region underlies the body region and at least a portion of the drift region but does not underlie the drain region.

15. The semiconductor device of claim 12 wherein at least a portion of the restrictive layer along a length of the restrictive layer is substantially depleted of carriers under a condition of the transistor being enabled.

16. The semiconductor device of claim 12 further including a bias contact formed as a second doped region of the first conductivity type in the first doped region.

17. The semiconductor device of claim 12 wherein a potential of the blocking layer is substantially constant under a condition of the transistor being enabled and disabled.

18. A semiconductor device comprising:
a semiconductor substrate;
a first doped region of a first conductivity type overlying the semiconductor substrate, the first doped region having a first doping concentration;
a second doped region of a second conductivity type on the first doped region, the second doped region having a second doping concentration;
a third doped region of the first conductivity type on the second doped region, the third doped region having a third doping concentration that is less than the second doping concentration; and
a body region in the third doped region;
a source region within the body region;

a drift region within the third doped region, the drift region having a fourth doping concentration that is greater than the first doping concentration;

a drain region within the drift region;

the first doped region and the second doped region extending to continuously underlie the source region, the drift region, and the drain region, and wherein the second doped region is electrically coupled to the body region.

19. The semiconductor device of claim 18 further including a bias contact formed as a fourth doped region of the first conductivity type within the third doped region wherein a potential of the first doped region is substantially constant for both an enabled and a disabled operational state of the transistor.

20. The semiconductor device of claim 19 wherein the fourth doped region is coupled to receive the potential independently of voltages applied to the source region, the body region, and the drain region.

* * * * *

UNITED STATES PATENT AND TRADEMARK OFFICE
CERTIFICATE OF CORRECTION

| | | |
|---|---|---|
| PATENT NO. | : 11,552,193 B2 | Page 1 of 1 |
| APPLICATION NO. | : 17/139748 | |
| DATED | : January 10, 2023 | |
| INVENTOR(S) | : Weize Chen et al. | |

It is certified that error appears in the above-identified patent and that said Letters Patent is hereby corrected as shown below:

In the Claims

In Claim 12: Column 12, Line 31, please change "a second doping concentration" to --a third doping concentration--.

Signed and Sealed this
Second Day of January, 2024

Katherine Kelly Vidal
*Director of the United States Patent and Trademark Office*